(12) United States Patent
Pickett et al.

(10) Patent No.: US 10,032,964 B2
(45) Date of Patent: Jul. 24, 2018

(54) SEMICONDUCTOR NANOPARTICLE-BASED MATERIALS

(71) Applicant: Nanoco Technologies Ltd., Manchester (GB)

(72) Inventors: Nigel Pickett, Manchester (GB); Imad Naasani, Manchester (GB); James Harris, Manchester (GB)

(73) Assignee: Nanoco Technologies Ltd., Manchester (GB)

( * ) Notice: Subject to any disclaimer, the term of this patent is extended or adjusted under 35 U.S.C. 154(b) by 0 days.

(21) Appl. No.: 14/624,750

(22) Filed: Feb. 18, 2015

(65) Prior Publication Data

US 2015/0179900 A1 Jun. 25, 2015

Related U.S. Application Data

(62) Division of application No. 12/888,982, filed on Sep. 23, 2010, now Pat. No. 8,957,401.

(Continued)

(30) Foreign Application Priority Data

Sep. 23, 2009 (GB) .................................. 0916700.8

(51) Int. Cl.
*H01L 33/50* (2010.01)
*C09K 11/02* (2006.01)
*C09K 11/56* (2006.01)
*C09K 11/70* (2006.01)
*C09K 11/88* (2006.01)

(52) U.S. Cl.
CPC ............ *H01L 33/502* (2013.01); *C09K 11/02* (2013.01); *C09K 11/025* (2013.01); *C09K 11/565* (2013.01); *C09K 11/70* (2013.01); *C09K 11/883* (2013.01); *H01L 33/505* (2013.01); *H01L 33/504* (2013.01); *H01L 2933/0025* (2013.01); *H01L 2933/0041* (2013.01)

(58) Field of Classification Search
CPC ............... H01L 51/5036; H01L 33/502; H01L 2933/0041; H01L 2933/0025; H01L 33/504; C09K 11/02; C09K 11/025
See application file for complete search history.

(56) References Cited

U.S. PATENT DOCUMENTS 7,544,725 B2 6/2009 Pickett et al.
2004/0227694 A1* 11/2004 Sun ...................... G09G 3/003
345/6

(Continued)

FOREIGN PATENT DOCUMENTS

CN 1687225 A 10/2005
JP HEI 09-050057 2/1997
(Continued)

*Primary Examiner* — Latanya N Crawford
(74) *Attorney, Agent, or Firm* — Blank Rome, LLP (57) ABSTRACT

In various embodiments, the present invention relates to a plurality of coated primary particles, each primary particle including a primary matrix material and containing a population of semiconductor nanoparticles, wherein each primary particle is provided with a separate layer of a surface coating material. Various methods of preparing such particles are described. Composite materials and light-emitting devices incorporating such primary particles are also described.

15 Claims, 5 Drawing Sheets

Related U.S. Application Data

(60) Provisional application No. 61/246,214, filed on Sep. 28, 2009.

(56) References Cited

U.S. PATENT DOCUMENTS

| | | | |
|---|---|---|---|
| 2006/0019098 A1 | 1/2006 | Chan et al. | |
| 2007/0125984 A1 | 6/2007 | Tian et al. | |
| 2008/0199930 A1* | 8/2008 | Lee | B01F 11/0266 435/173.1 |
| 2009/0081842 A1 | 3/2009 | Nelson et al. | |
| 2009/0315016 A1* | 12/2009 | Elam | B82Y 10/00 257/15 |
| 2010/0032645 A1* | 2/2010 | Choi | H01L 51/5036 257/13 |
| 2010/0069550 A1* | 3/2010 | Gao | C08K 3/22 524/401 |
| 2010/0123155 A1* | 5/2010 | Pickett | B82Y 15/00 257/98 |
| 2010/0148156 A1* | 6/2010 | Jang | B82Y 30/00 257/40 |
| 2012/0181919 A1* | 7/2012 | Wei | C09K 11/02 313/503 |

FOREIGN PATENT DOCUMENTS

| | | |
|---|---|---|
| JP | 2002214139 | 7/2002 |
| JP | 2002275374 | 9/2002 |
| JP | 2009108126 | 5/2009 |
| JP | 2009173905 | 6/2009 |
| JP | 2009190976 | 8/2009 |
| WO | 2005017951 | 2/2005 |
| WO | 2005108473 | 11/2005 |

\* cited by examiner

SEMICONDUCTOR NANOPARTICLE-BASED MATERIALS

CROSS-REFERENCE TO RELATED APPLICATIONS

This application is a division of U.S. patent application Ser. No. 12/888,982 filed Sep. 23, 2010, which claims the benefit of and priority to U.K. Patent Application GB 0916700.8 filed Sep. 23, 2009, and U.S. Provisional Patent Application No. 61/246,214 filed Sep. 28, 2009, the disclosures of which are hereby incorporated by reference in their entireties.

STATEMENT REGARDING FEDERALLY SPONSORED RESEARCH OR DEVELOPMENT

Not Applicable

BACKGROUND OF THE INVENTION

1. Field of the Invention

In various embodiments, the present invention relates to semiconductor nanoparticle-based materials, particularly, but not exclusively, quantum dot-containing beads for use in the fabrication of quantum dot-based light emitting devices.

2. Description of the Related Art Including Information Disclosed Under 37 CFR 1.97 and 1.98.

There has been substantial interest in exploiting the properties of compound semiconductors consisting of particles with dimensions in the order of 2-50 nm, often referred to as quantum dots (QDs) or nanocrystals. These materials are of commercial interest due to their size-tuneable electronic properties which can be exploited in many commercial applications such as optical and electronic devices, and other applications that range from biological labelling, photovoltaics, catalysis, biological imaging, LEDs, general space lighting and electroluminescent displays, amongst many new and emerging applications.

The most studied of semiconductor materials have been the chalcogenide II-VI materials, namely ZnS, ZnSe, CdS, CdSe, CdTe; most noticeably CdSe due to its tuneability over the visible region of the spectrum. Reproducible methods for the large scale production of these materials have been developed from "bottom up" techniques, whereby particles are prepared atom-by-atom, i.e., from molecules to clusters to particles, using "wet" chemical procedures.

Two fundamental factors, both related to the size of the individual semiconductor nanoparticle, are responsible for their unique properties. The first is the large surface to volume ratio; as a particle becomes smaller, the ratio of the number of surface atoms to those in the interior increases. This leads to the surface properties playing an important role in the overall properties of the material. The second factor being, with many materials including semiconductor nanoparticles, that there is a change in the electronic properties of the material with size; moreover, because of quantum confinement effects the band gap gradually becomes larger as the size of the particle decreases. This effect is a consequence of the confinement of an 'electron in a box' giving rise to discrete energy levels similar to those observed in atoms and molecules, rather than a continuous band as observed in the corresponding bulk semiconductor material. Thus, for a semiconductor nanoparticle, because of physical parameters, the electron and hole produced by the absorption of electromagnetic radiation (a photon, with energy greater than the first excitonic transition), are closer together than they would be in the corresponding macrocrystalline material, moreover the Coulombic interaction cannot be neglected. This leads to a narrow bandwidth emission, which is dependent upon the particle size and composition of the nanoparticle material. Thus, quantum dots have higher kinetic energy than the corresponding macrocrystalline material and consequently the first excitonic transition (band gap) increases in energy with decreasing particle diameter.

Core semiconductor nanoparticles, which consist of a single semiconductor material along with an outer organic passivating layer, tend to have relatively low quantum efficiencies due to electron-hole recombination occurring at defects and dangling bonds situated on the nanoparticle surface which can lead to non-radiative electron-hole recombinations. One method to eliminate defects and dangling bonds on the inorganic surface of the quantum dot is to grow a second inorganic material, having a wider band-gap and small lattice mismatch to that of the core material, epitaxially on the surface of the core particle to produce a "core-shell" particle. Core-shell particles separate any carriers confined in the core from surface states that would otherwise act as non-radiative recombination centres. One example is a ZnS shell grown on the surface of a CdSe core. Another approach is to prepare a core-multi shell structure where the electron-hole pair is completely confined to a single shell layer consisting of a few monolayers of a specific material such as a quantum dot-quantum well structure. Here, the core is of a wide band gap material, followed by a thin shell of narrower band gap material, and capped with a further wide band gap layer, such as CdS/HgS/CdS grown using substitution of Hg for Cd on the surface of the core nanocrystal to deposit just a few monolayers of HgS, which is then over-grown by a monolayer of CdS. The resulting structures exhibit clear confinement of photo-excited carriers in the HgS layer. To add further stability to quantum dots and help to confine the electron-hole pair one of the most common approaches is by epitaxially growing a compositionally graded alloy layer on the core; this can help to alleviate strain that could otherwise led to defects. Moreover, for a CdSe core, in order to improve structural stability and quantum yield, rather growing a shell of ZnS directly on the core a graded alloy layer of $Cd_{1-x}Zn_xSe_{1-y}S_y$ can be used. This has been found to greatly enhance the photoluminescence emission of the quantum dots.

Doping quantum dots with atomic impurities is an efficient way also of manipulating the emission and absorption properties of the nanoparticle. Procedures for doping of wide band gap materials, such as zinc selenide and zinc sulfide, with manganese and copper (ZnSe:Mn or ZnS:Cu), have been developed. Doping with different luminescence activators in a semiconducting nanocrystal can tune the photoluminescence and electroluminescence at energies even lower than the band gap of the bulk material, whereas the quantum size effect can tune the excitation energy with the size of the quantum dots without having a significant change in the energy of the activator-related emission.

The widespread exploitation of quantum dot nanoparticles has been restricted by their physical/chemical instability and incompatibility with many of the materials and/or processes required to exploit the quantum dots to their full potential, such as incorporation into solvents, inks, polymers, glasses, metals, electronic materials, electronic devices, bio-molecules and cells. Consequently, a series of quantum dot surface modification procedures has been employed to render the quantum dots more stable and compatible with the materials and/or processing requirements of a desired application.

A particularly attractive potential field of application for quantum dots is the development of next generation light-emitting diodes (LEDs). LEDs are becoming increasingly important in modern-day life and it is envisaged that they have the potential to become one of the major applications for quantum dots, in for example, automobile lighting, traffic signals, general lighting, liquid crystal display (LCD) backlighting and display screens.

Currently, LED devices are made from inorganic solid-state compound semiconductors, such as AlGaAs (red), AlGaInP (orange-yellow-green), and AlGaInN (green-blue); however, using a mixture of the available solid-state compound semiconductors, solid-state LEDs which emit white light cannot be produced. Moreover, it is difficult to produce "pure" colours by mixing solid-state LEDs of different frequencies. Therefore, currently the main method of colour mixing to produce a required colour, including white, is to use a combination of phosphorescent materials which are placed on top of the solid-state LED whereby the light from the LED (the "primary light") is absorbed by the phosphorescent material and then re-emitted at a different frequency (the "secondary light"), i.e., the phosphorescent materials down-convert the primary light to the secondary light. Moreover, the use of white LEDs produced by phosphor down-conversion leads to lower cost and simpler device fabrication than a combination of solid-state red-green-blue LEDs.

Current phosphorescent materials used in down-converting applications absorb UV or mainly blue light and convert it to longer wavelengths, with most phosphors currently using trivalent rare-earth doped oxides or halophosphates. White emission can be obtained by blending phosphors which emit in the blue, green and red regions with that of a blue or UV-emitting solid-state device, i.e., a blue-light-emitting LED plus a green phosphor such as, $SrGa_2S_4:Eu_2^+$, and a red phosphor such as, $SrSiEu_2^+$ or a UV-light-emitting LED plus a yellow phosphor such as, $Sr_2P_2O_7:Eu_2^+;Mu_2^+$, and a blue-green phosphor. White LEDs can also be made by combining a blue LED with a yellow phosphor; however, colour control and colour rendering are poor when using this methodology due to lack of tunability of the LEDs and the phosphor. Moreover, conventional LED phosphor technology uses down-converting materials that have poor colour rendering (i.e., colour rendering index (CRI)<75).

Rudimentary quantum dot-based light-emitting devices have been made by embedding colloidally produced quantum dots in an optically clear (or sufficiently transparent) LED encapsulation medium, typically a silicone or an acrylate, which is then placed on top of a solid-state LED. The use of quantum dots potentially has some significant advantages over the use of the more conventional phosphors, such as the ability to tune the emission wavelength, strong absorption properties and low scattering if the quantum dots are mono-dispersed.

For the commercial application of quantum dots in next-generation light-emitting devices, the quantum dots should be incorporated into the LED encapsulating material while remaining as fully mono-dispersed as possible and without significant loss of quantum efficiency. The methods developed to date are problematic, not least because of the nature of current LED encapsulants. Quantum dots can agglomerate when formulated into current LED encapsulants, thereby reducing the optical performance of the quantum dots. Moreover, even after the quantum dots have been incorporated into the LED encapsulant, oxygen can still migrate through the encapsulant to the surfaces of the quantum dots, which can lead to photo-oxidation and, as a result, a drop in quantum yield (QY).

In view of the significant potential for the application of quantum dots across such a wide range of applications, including but not limited to, quantum dot-based light-emitting devices, work has already been undertaken by various groups to try to develop methods to increase the stability of quantum dots so as to make them brighter, more long-lived, and/or less sensitive to various types of processing conditions. For example, reasonably efficient quantum dot-based light-emitting devices can be fabricated under laboratory conditions building on current published methods; however, there remain significant challenges to the development of quantum dot-based materials and methods for fabricating quantum dot-based devices, such as light-emitting devices, on an economically viable scale and which would provide sufficiently high levels of performance to satisfy consumer demand.

BRIEF SUMMARY OF THE INVENTION

Various embodiments of the present invention obviate or mitigate one or more of the above problems with semiconductor nanoparticle-based materials and/or current methods for fabricating such materials.

According to a first aspect, embodiments of the present invention feature a plurality of coated primary particles, each primary particle including a primary matrix material and containing a population of semiconductor nanoparticles, wherein each primary particle is provided with a separate layer of a surface coating material.

Embodiments of the current invention thus provide a means by which the robustness, and consequently, the performance of semiconductor nanoparticles may be improved for use in a wide range of applications, particularly, but not exclusively the fabrication of semiconductor nanoparticle-based light-emitting devices, preferably where the device incorporates an LED as a primary light source and the semiconductor nanoparticles as a secondary light source. By providing each primary particle with its own dedicated, distinct coating, the primary particles remain as separate, individual particles, and may still therefore be manipulated and used as separate particles, but by virtue of the coating are less sensitive to their surrounding environment and subsequent processing steps.

Figure 1:
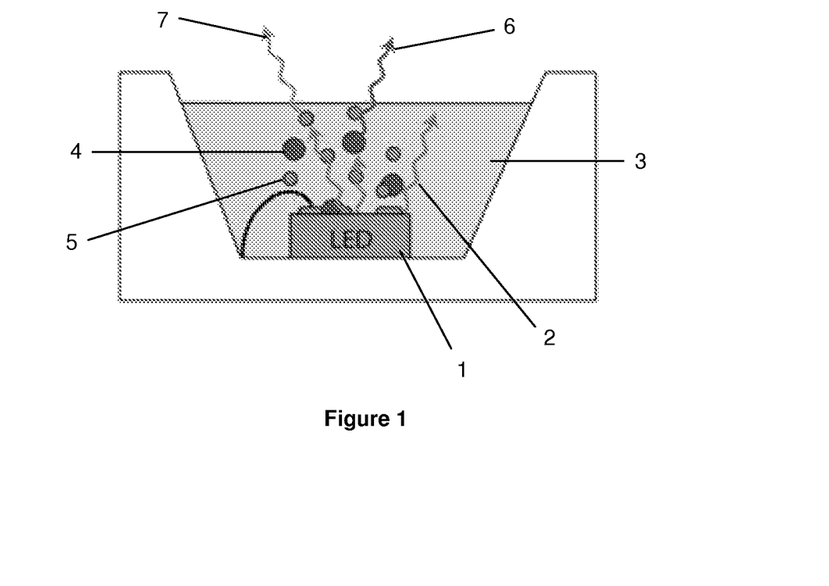
FIG. 1 schematically depicts a quantum dot-based light-emitting device according to an aspect of the present invention.

In a preferred embodiment a plurality of quantum dots are incorporated into one or more silica beads whose surface has been treated with an acrylate monomer and subsequently polymerised to provide a polymeric surface barrier layer, which quantum dot-containing beads are then embedded or entrapped within a host LED encapsulation material such as a silicone, an epoxy resin, a (meth)acrylate, or a polymeric material. Such an arrangement is depicted schematically in FIG. 1, wherein an LED 1, which is arranged to emit blue primary light 2 upon the application of current, is submerged in a commercially available LED encapsulant 3 in which is embedded a plurality of quantum dot-containing silica beads 4, 5 provided with a polyacrylate protective surface coating; some of the beads 4 contain quantum dots that emit red secondary light 6 upon excitation by the blue primary light from the LED 1, and the remaining beads 4 contain quantum dots which emit green secondary light 7 upon excitation by the blue primary light from the LED 1.

The term "bead" is used herein for convenience and is not intended to impose any particular size or shape limitation to the material described as a bead. Thus, for example, the beads may be spherical but other configurations are possible. Where reference is made herein to "microbeads" this is intended to refer to beads as defined above having a dimension on the micron scale.

The term "coating" is used herein to refer to one or more layers of material provided on another material, which may partially or fully cover the exterior surface or solvent accessible surface of that other material. The material of the coating may penetrate at least partially into the internal structure of the material to which it has been applied, provided the coating still affords a level of protection or functions in some way as a barrier to the passage of potentially harmful species, e.g., oxygen, through the coated material. It will be appreciated from the wording used to define the various aspects of the present invention herein that the coating applied to each primary particle results in the production of a plurality of separate, distinct coated particles rather than a plurality of particles contained or encapsulated within the same, unitary matrix-type material, such as a plurality of resin beads dispersed throughout an LED encapsulant.

The nanoparticle-containing primary particles or beads are preferably provided in the form of microbeads. By pre-loading small microbeads, which may range in size from 50 nm to 500 μm or more preferably 25 nm to 0.1 mm or more preferably still 20 nm to 0.5 mm in diameter, with quantum dots, and then providing a surface coating of, for example, a polymer or oxide material, the resulting coated beads are more stable towards their surrounding environment and/or subsequent processing conditions, such as the incorporation of the quantum dot-containing beads into an LED encapsulation material on a UV or blue LED. As a result, not only does handling of the quantum dots become easier, but their optical performance may be improved and it may become simpler to tune the colour of the light they emit, for example when used in an LED-based device. Moreover, this approach is simpler than attempting to incorporate quantum dots directly into an LED encapsulate (for example, a silicone, an epoxy, a (meth)acrylate, a polymeric material, or the like) in terms of ease of colour rendering, processing, and reproducibility and offers greater quantum dot stability to photo-oxidation.

The quantum dot-containing beads may be made to any desirable size, such as the same size as currently employed YAG phosphor materials which range from 10 to 100 μm and may thus be supplied to existing LED manufacturers in a similar form to that of the current commercially used phosphor materials. Moreover, the coated quantum dot-containing beads are in a form that is compatible with the existing LED fabrication infrastructure.

With the advantage of very little or no loss of quantum dot quantum yield (QY) in processing; this new approach of using coated quantum dot-containing beads leads to less loss of quantum efficiency than when formulating the quantum dots directly into a LED encapsulation medium or when using uncoated quantum dot beads. Because there is very little or no loss of quantum yield it is easier to colour render and less binning is required. It has been shown that when formulating quantum dots directly into an encapsulation medium using prior art methods, colour control is very difficult due to quantum dot re-absorption or loss of quantum yield and shifting of the PL max position. Moreover, batch to batch, i.e., device-to-device, reproducibility is very difficult or impossible to achieve. By pre-loading the quantum dots into one or more beads and then coating the beads the colour of the light emitted by the device is of higher quality, easier to control, and is more reproducible.

By incorporating known amounts of quantum dots into beads and providing the beads with a protective surface coating, migration of deleterious species, such as moisture, oxygen, and/or free radicals, is eliminated or at least reduced, thereby eliminating or at least minimising these common hurdles to the industrial production of quantum dot-based materials and devices.

According to a second aspect, embodiments of the present invention feature a method for preparing a plurality of coated primary particles, each primary particle including a primary matrix material and containing a population of semiconductor nanoparticles, the method including providing each of said primary particles with a separate layer of a surface coating material.

According to a further aspect, embodiments of the present invention feature a light-emitting device including a primary light source in optical communication with a formulation including a plurality of coated primary particles according to embodiments of the first aspect of the present invention embedded in a host light-emitting diode encapsulation medium.

BRIEF DESCRIPTION OF THE SEVERAL VIEWS OF THE DRAWING(S)

Embodiments of the present invention are illustrated with reference to the following non-limiting figures in which.

DETAILED DESCRIPTION OF THE INVENTION

Primary Matrix Material

The primary matrix material is preferably an optically transparent medium, i.e., a medium through which light can pass, and which may be, but does not have to be substantially optically clear. The primary matrix material, preferably in the form of a bead or microbead, may be a resin, polymer, monolith, glass, sol gel, epoxy, silicone, (meth) acrylate, or the like, or it may include silica.

Examples of preferred primary matrix materials include acrylate polymers (e.g., polymethyl(meth)acrylate, polybutylmethacrylate, polyoctylmethacrylate, alkylcyanoacrylates, polyethyleneglycol dimethacrylate, polyvinylacetate, etc.), epoxides (e.g., EPOTEK 301 A+B Thermal curing epoxy, EPOTEK OG112-4 single pot UV curing epoxy, or EX0135A and B Thermal curing epoxy), polyamides, polyimides, polyesters, polycarbonates, poly-thioethers, poly-acrylonitryls, polydienes, polystyrene polybutadiene copolymers (Kratons), pyrelenes, poly-para-xylylene (parylenes), silica, silica-acrylate hybrids, polyetheretherketone (PEEK), polyvinylidene fluoride (PVDF), polydivinyl benzene, polyethylene, polypropylene, polyethylene terephthalate (PET), polyisobutylene (butyl rubber), polyisoprene, and cellulose derivatives (methyl cellulose, ethyl cellulose, hydroxypropylmethyl cellulose, hydroxypropylmethylcellulose phthalate, nitrocellulose), and combinations thereof.

Primary Particle Surface Coating Materials

One of the intended functions of the coating provided on the primary particles is to provide each primary particle with a protective barrier to prevent the passage or diffusion of potentially deleterious species, e.g., oxygen, moisture, or free radicals, from the external environment through the primary matrix material to the semiconductor nanoparticles. As a result, the semiconductor nanoparticles are less sensitive to their surrounding environment and the various processing conditions typically required to utilise the nanoparticles in applications such as the fabrication of LED-based light-emitting devices.

The coating is preferably a barrier to the passage of oxygen or any type of oxidising agent through the primary matrix material. The coating may be a barrier to the passage of free radical species through the primary matrix material, and/or is preferably a moisture barrier so that moisture in the environment surrounding the primary particles does not contact the semiconductor nanoparticles within the primary particles.

The coating may provide a layer of coating material on a surface of the primary particle of any desirable thickness provided it affords the required level of protection. The surface layer coating may be around 1 to 10 nm thick, up to around 400 to 500 nm thick, or more. Preferred layer thicknesses are in the range 1 nm to 200 nm, more preferably around 5 to 100 nm.

In a first preferred embodiment, the coating includes an inorganic material, such as a dielectric (insulator), a metal oxide, a metal nitride, or a silica-based material (e.g., a glass).

The metal oxide may be a single metal oxide (i.e., oxide ions combined with a single type of metal ion, e.g., $Al_2O_3$), or may be a mixed metal oxide (i.e., oxide ions combined with two or more types of metal ion, e.g., $SrTiO_3$). The metal ion(s) of the (mixed) metal oxide may be selected from any suitable group of the periodic table, such as group 2, 13, 14 or 15, or may be a transition metal, d-block metal, or lanthanide metal.

Preferred metal oxides are selected from the group consisting of $Al_2O_3$, $B_2O_3$, $Co_2O_3$, $Cr_2O_3$, $CuO$, $Fe_2O_3$, $Ga_2O_3$, $HfO_2$, $In_2O_3$, $MgO$, $Nb_2O_5$, $NiO$, $SiO_2$, $SnO_2$, $Ta_2O_5$, $TiO_2$, $ZrO_2$, $Sc_2O_3$, $Y_2O_3$, $GeO_2$, $La_2O_3$, $CeO_2$, $PrO_x$ (x=appropriate integer), $Nd_2O_3$, $Sm_2O_3$, $EuO_y$ (y=appropriate integer), $Gd_2O_3$, $Dy_2O_3$, $Ho_2O_3$, $Er_2O_3$, $Tm_2O_3$, $Yb_2O_3$, $Lu_2O_3$, $SrTiO_3$, $BaTiO_3$, $PbTiO_3$, $PbZrO_3$, $Bi_mTi_nO$ (m=appropriate integer; n=appropriate integer), $Bi_aSi_bO$ (a=appropriate integer; b=appropriate integer), $SrTa_2O_6$, $SrBi_2Ta_2O_9$, $YScO_3$, $LaAlO_3$, $NdAlO_3$, $GdScO_3$, $LaScO_3$, $LaLuO_3$, $Er_3Ga_5O_{13}$.

Preferred metal nitrides may be selected from the group consisting of BN, AlN, GaN, InN, $Zr_3N_4$, $Cu_2N$, $Hf_3N_4$, $SiN_c$ (c=appropriate integer), TiN, $Ta_3N_5$, Ti—Si—N, Ti—Al—N, TaN, NbN, MoN, $WN_d$ (d=appropriate integer), $WN_eC_f$ (e=appropriate integer; f=appropriate integer).

The inorganic coating may include silica in any appropriate crystalline form.

The coating may incorporate an inorganic material in combination with an organic or polymeric material. By way of example, in a preferred embodiment, the coating is an inorganic/polymer hybrid, such as a silica-acrylate hybrid material.

In a second preferred embodiment, the coating includes a polymeric material, which may be a saturated or unsaturated hydrocarbon polymer, or may incorporate one or more heteroatoms (e.g., O, S, N, halo) or heteroatom-containing functional groups (e.g., carbonyl, cyano, ether, epoxide, amide, and the like).

Examples of preferred polymeric coating materials include acrylate polymers (e.g., polymethyl(meth)acrylate, polybutylmethacrylate, polyoctylmethacrylate, alkylcyanoacrylates, polyethyleneglycol dimethacrylate, polyvinylacetate, etc.), epoxides (e.g., EPOTEK 301 A+B Thermal curing epoxy, EPOTEK OG112-4 single pot UV curing epoxy, or EX0135A and B Thermal curing epoxy), polyamides, polyimides, polyesters, polycarbonates, poly-thioethers, polyacrylonitryls, polydienes, polystyrene polybutadiene co-polymers (Kratons), pyrelenes, poly-para-xylylene (parylenes), polyetheretherketone (PEEK), polyvinylidene fluoride (PVDF), polydivinyl benzene, polyethylene, polypropylene, polyethylene terephthalate (PET), polyisobutylene (butyl rubber), polyisoprene, and cellulose derivatives (methyl cellulose, ethyl cellulose, hydroxypropylmethyl cellulose, hydroxypropyl-methylcellulose phthalate, nitrocellulose), and combinations thereof.

By incorporating quantum dots into primary particle materials of the kind described above and coating the particles, the otherwise reactive quantum dots may be protected from the potentially damaging surrounding chemical environment. Moreover, by placing a number of quantum dots into a single bead, for example in the size range from 20 nm to 500 µm in diameter, and providing the bead with a suitable protective coating of, for example, a polymeric or inorganic material, the resulting coated QD-bead is generally more stable than either free "naked" quantum dots, or uncoated QD-beads to the types of chemical, mechanical, thermal, and/or photo-processing steps which are required to incorporate quantum dots in most commercial applications, such as when employing quantum dots as down-converters in a "QD-solid-state-LED" light-emitting device.

Each primary particle may contain any desirable number and/or type of semiconductor nanoparticles. Thus, the primary matrix material of the primary particle may contain a single type of semiconductor nanoparticle, e.g., InP, InP/ZnS, or CdSe, of a specific size range, such that the plurality of coated QD-containing beads emits monochromatic light of a pre-defined wavelength, i.e., colour. The colour of the emitted light may be adjusted by varying the type of semiconductor nanoparticle material used, e.g., changing the size of the nanoparticle, the nanoparticle core semiconductor material, and/or adding one or more outer shells of different semiconductor materials.

Moreover, colour control may also be achieved by incorporating different types of semiconductor nanoparticles, for example nanoparticles of different size and/or chemical composition within the primary matrix material of each particle.

Furthermore, the colour and colour intensity may be controlled by selecting an appropriate number of semiconductor nanoparticles within each particle. Preferably each primary particle contains at least around 1000 semiconductor nanoparticles of one or more different types, more preferably at least around 10,000, more preferably at least around 50,000, and most preferably at least around 100,000 semiconductor nanoparticles of one or more different types.

Where the primary particles are provided in the preferred form of beads or microbeads, some or all of the beads preferably contain one or more semiconductor nanoparticle capable of secondary light emission upon excitation by primary light emitted by a primary light source (e.g., an LED).

The quantum-dot containing primary particles may be coated and then dispersed in a secondary matrix material, which may be the same or different to the primary matrix material.

In various embodiments, a further aspect of the present invention provides a composite material incorporating a plurality of coated primary particles according to the first aspect of the present invention dispersed within a secondary matrix material.

In various embodiments, a still further aspect provides a light-emitting device including a primary light source in optical communication with a formulation including a composite material according to above further aspect embedded in a host light-emitting diode encapsulation medium.

The secondary matrix material may be selected from the group of primary matrix materials set out above. By way of example, said secondary matrix material may include a material selected from the group consisting of a polymer, a resin, a monolith, a glass, a sol gel, an epoxy, a silicone, and a (meth)acrylate.

Additionally, the secondary matrix material may be formed into one or more secondary particles containing one or more primary particles. The secondary particles may be provided with a surface coating in a similar manner to that described above in respect of the primary particles. Accordingly, said secondary matrix material may be in the form of one or more secondary particles and a surface of the or each secondary particle may be provided with a separate layer of a further surface coating material. Preferably said further surface coating material includes a material selected to provide the or each secondary particle with a protective barrier to prevent the passage or diffusion of potentially deleterious species from the external environment through the secondary matrix material to the primary matrix material.

Alternatively, the quantum dots may first be captured within a matrix material, such as a polymeric bead, and then each of those beads may be contained within a primary matrix material to form the primary particles of the first and second aspects of the present invention, which are then provided with a surface coating. Thus, the semiconductor nanoparticles contained within the primary matrix material may be "naked" nanoparticles, or may already be contained within a matrix material before being captured within the primary matrix material and coated.

The plurality of coated primary particles may be dispersed within an encapsulating medium, such as an LED encapsulant, to provide a robust QD-containing formulation which may then safely be used in subsequent processing steps, for example, to deposit a desired amount of such a formulation on to an LED chip to provide an QD/LED-based light-emitting device. Any desirable number of beads may be dispersed or embedded within the encapsulating medium, for example, the formulation may contain 1 to 10,000 beads, more preferably 1 to 5000 beads, and most preferably 5 to 1000 beads.

It should also be appreciated that the encapsulating medium may have embedded therein one or more type of coated semiconductor nanoparticle-containing primary particles. That is, two or more different types of primary particles (one or more containing the nanoparticles) may be embedded within the same encapsulating medium. In this way, where the population of nanoparticles contains more than one different type of nanoparticle, the nature of the primary particle may be selected for optimum compatibility with both the different types of nanoparticles and the particular medium used.

Advantages of coated quantum dot-containing beads over free quantum dots or uncoated quantum dot-containing beads may include greater stability to air and moisture, greater stability to photo-oxidation, and/or greater stability to mechanical processing. Moreover, by pre-loading small microbeads, which may range in size from a few 50 nm to 500 µm, with quantum dots and individually coating the microbeads prior to incorporating a plurality of such quantum dot-containing beads into an LED encapsulation material on a UV or blue LED, it is a relatively simple process to change, in a controllable and reproducible manner, the colour of the light emitted by the resulting LED-based light-emitting device.

Semiconductor Nanoparticles

Any desirable type of semiconductor nanoparticle may be employed in embodiments of the present invention. In a preferred embodiment, the nanoparticle contains ions, which may be selected from any desirable group of the periodic table, such as but not limited to group 11, 12, 13, 14, 15 or 16 of the periodic table. The nanoparticle may incorporate transition metal ions or d-block metal ions. It is preferred that the nanoparticles contain first and second ions with the first ion preferably selected from group 11, 12, 13 or 14 and the second ion preferably selected from group 14, 15 or 16 of the periodic table. The nanoparticles may contain one or more semiconductor materials selected from the group consisting of CdO, CdS, CdSe, CdTe, ZnO, ZnS, ZnSe, ZnTe, InP, InAs, InSb, AlP, AlS, AlAs, AlSb, GaN, GaP, GaAs, GaSb, PbS, PbSe, Si, Ge, MgS, MgSe, MgTe, and combinations thereof. Moreover, the nanoparticles may be binary, tertiary or quaternary core, core-shell or core-multi shell, doped, or graded nanoparticles.

Any appropriate method may be employed to produce the semiconductor nanoparticles employed in the various aspects of the present invention. That being said, it is preferred that said semiconductor nanoparticles be produced by converting a nanoparticle precursor composition to the material of the nanoparticles in the presence of a molecular cluster compound under conditions permitting seeding and growth of the nanoparticles on the cluster compound. The method may employ the methodology set out in the applicant's European patent application (Publication No. EP1743054A) and U.S. Patent Application Publication No. 2007/0202333, the entire disclosures of which are incorporated by reference herein.

Conveniently, the nanoparticles typically incorporate first and second ions and the nanoparticle precursor composition typically includes first and second nanoparticle precursor species containing the first and second ions, respectively, which are combined, preferably in the presence of a molecular cluster compound, as exemplified below in Synthetic Methods 1.1 and 1.2.

The first and second precursor species may be separate species in the precursor composition or may form part of a single molecular species containing both the first and second ions.

In the preferred embodiments employing a molecular cluster compound, it is preferred that the molecular clusters contain third and fourth ions. At least one of said third and fourth ions is preferably different to said first and second ions contained in the first and second nanoparticle precursor species respectively. The third and fourth ions may be selected from any desirable group of the periodic table, such as but not limited to group 11, 12, 13, 14, 15 or 16 of the periodic table. The third and/or fourth ion may be a transition metal ion or a d-block metal ion. Preferably the third ion is selected from group 11, 12, 13 or 14 and the fourth ion is selected from group 14, 15 or 16 of the periodic table.

By way of example, the molecular cluster compound may incorporate third and fourth ions from groups 12 and 16 of the periodic table respectively and the first and second ions derived from the first and second nanoparticle precursor species may be taken from groups 13 and 15 of the periodic table respectively as in Synthetic Method 1.2. The methodology described in the applicant's International PCT patent application (Application No. PCT/GB2008/002560) and U.S. Pat. No. 7,588,828, the entire disclosures of which are incorporated by reference herein, may be employed.

It will be appreciated that during the reaction of the first and second nanoparticle precursor species, the first nanoparticle precursor species may be added in one or more portions and the second nanoparticle precursor species may be added in one or more portions. The first nanoparticle precursor species is preferably added in two or more portions. In this case, it is preferred that the temperature of a reaction mixture containing the first and second nanoparticle precursor species be increased between the addition of each portion of the first precursor species. Additionally or alternatively, the second nanoparticle precursor species may be added in two or more portions, whereupon the temperature of a reaction mixture containing the first and second nanoparticle precursor species may be increased between the addition of each portion of the second precursor species. The methodology described in the applicant's European patent application (Application No. 06808360.9) and U.S. Patent Application Publication No. 2007/0104865, the entire disclosures of which are incorporated by reference herein, may be used.

The coordination about the final inorganic surface atoms in any core, core-shell, or core-multi shell, doped, or graded nanoparticle is typically incomplete, with highly reactive non-fully coordinated atoms acting as "dangling bonds" on the surface of the particle, which can lead to particle agglomeration. This problem is typically overcome by passivating (capping) the "bare" surface atoms with protecting organic groups.

In many cases, the capping agent is the solvent in which the nanoparticles have been prepared, and consists of a Lewis base compound, or a Lewis base compound diluted in an inert solvent such as a hydrocarbon. There is a lone pair of electrons on the Lewis base capping agent that are capable of a donor-type coordination to the surface of the nanoparticle; ligands of this kind include, but are not limited to, mono- or multi-dentate ligands such as phosphines (trioctylphosphine, triphenylphosphine, t-butylphosphine, etc.), phosphine oxides (trioctylphosphine oxide, triphenylphosphine oxide, etc.), alkyl phosphonic acids, alkyl-amines (hexadecylamine, octylamine, etc.), aryl-amines, pyridines, long chain fatty acids, and thiophenes.

In addition to the outermost layer of organic material or sheath material (capping agent) helping to inhibit nanoparticle-nanoparticle aggregation, this layer may also protect the nanoparticles from their surrounding electronic and chemical environments, and provide a means of chemical linkage to other inorganic, biological or organic material, whereby the functional group is pointing away from the nanoparticle surface and is available to bond/react/interact with other available molecules. Examples include, but are not limited to, amines, alcohols, carboxylic acids, esters, acid chloride, anhydrides, ethers, alkyl halides, amides, alkenes, alkanes, alkynes, allenes, amino acids, azides, groups, etc. The outermost layer (capping agent) of a quantum dot may also include or consist of a coordinated ligand that processes a functional group that is polymerisable and may be used to form a polymer layer around the nanoparticle. The outermost layer may also include or consist of organic units that are directly bonded to the outermost inorganic layer such as via a disulphide bond between the inorganic surface (e.g., ZnS) and a thiol capping molecule. These may also possess additional functional group(s), not bonded to the surface of the particle, which may be used to form a polymer around the particle, or for further reaction/interaction/chemical linkage.

An example of a material to which nanoparticle surface binding ligands may be linked is the primary matrix material from which the primary particles are formed. There are a number of approaches to incorporate semiconductor nanoparticles, such as quantum dots, into the types of primary matrix materials described hereinbefore by pre-coating the nanoparticles with ligands that are compatible in some way with the matrix material of the primary particles. By way of example, in the preferred embodiment where the semiconductor nanoparticles are to be incorporated into polymeric beads, the nanoparticles may be produced so as to possess surface ligands which are polymerizable, hydrophobic, hydrophilic, positively or negatively charged, or functionalised with a reactive group capable of associating with the polymer of the polymeric beads by chemical reaction, covalent linkage or non-covalent interaction (e.g., interchelation).

The inventors have, in various embodiments, taken quantum dots prepared using any desirable method, incorporated these quantum dots into silica or polymer beads, and then coated the beads with a protective barrier layer of a material such as a polyacrylate or dielectric metal oxide like aluminum oxide, to provide significantly more robust, easily processible quantum dot-containing materials. Coated quantum dot-containing beads of this kind may be employed in a wide range of applications, particularly, but not exclusively, the fabrication of LED-based light-emitting devices wherein the coated QD-beads are embedded within a host LED encapsulant and then deposited onto a solid-state LED chip to form a quantum dot-based light-emitting device.

Incorporating Quantum Dots into Beads

Figure 4:
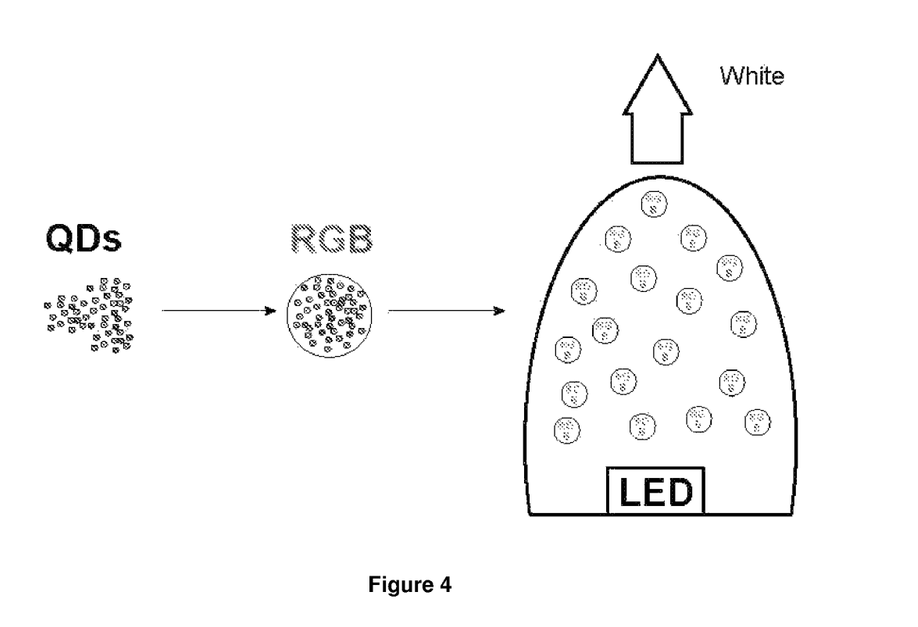
FIG. 4 is a schematic representation of a coated QD-bead-based light-emitting device employing multi-coloured, multiple quantum dot types in each coated bead such that each coated bead emits white secondary light.
Figure 5:
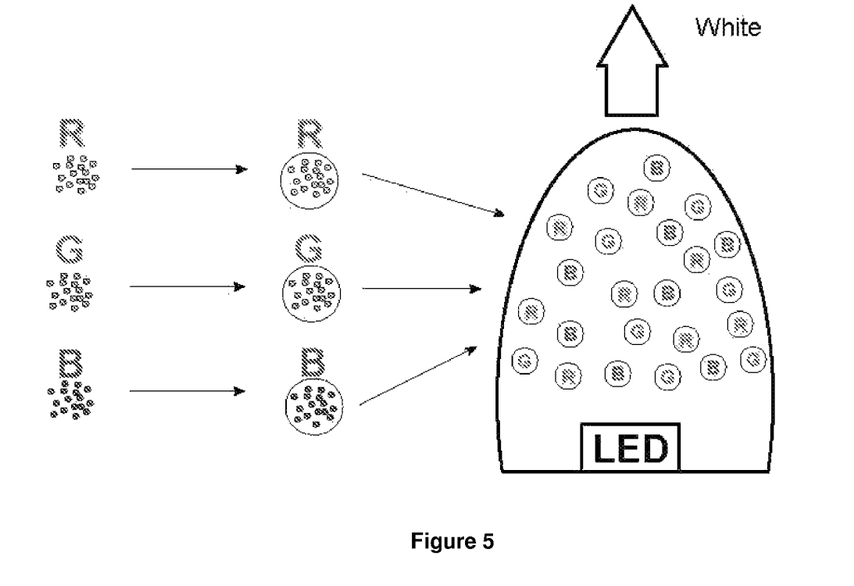
FIG. 5 is a schematic representation of a coated QD-bead-based light-emitting device employing multi-coloured, multiple quantum dot types in different beads such that each coated bead contains a single quantum dot type emitting a single colour, a mixture of the coated beads combining to produce white secondary light.
Figure 6:
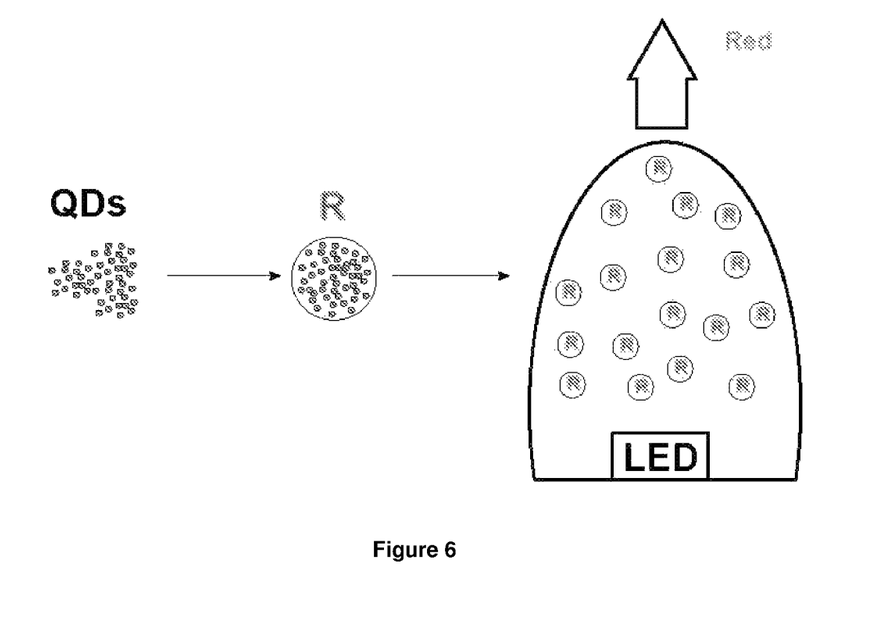
FIG. 6 is a schematic representation of a coated QD-bead-based light-emitting device employing singly coloured, single quantum dot type in all coated beads such that a mixture of the coated beads emits a single colour of secondary light (in this case, red light)

Considering the initial step of incorporating quantum dots into beads, a first option is to incorporate the quantum dots directly into the beads. A second option is to immobilise the quantum dots in beads through physical entrapment. Typically, using these methods, a population of beads that contain just a single type of quantum dot (e.g., one colour) may be made by incorporating a single type of quantum dot into the beads. Alternatively, beads that contain two or more types of quantum dot (e.g., two or more colours) may be constructed by incorporating a mixture of two or more types of quantum dot (e.g., material and/or size) into the beads. Such mixed beads may then be combined in any suitable ratio to emit any desirable colour of secondary light following excitation by the primary light emitted by the primary light source (e.g., LED). This is exemplified in FIGS. 4 to 6, which schematically show coated QD-bead light emitting devices including respectively: a) multi-coloured, multiple quantum dot types in each bead such that each bead emits white secondary light; b) multi-coloured, multiple quantum dot types in different beads such that each bead contains a single quantum dot type emitting a single colour, a mixture of the beads combining to produce white secondary light; and c) singly coloured, single quantum dot type in all beads such that a mixture of the beads emits a single colour of secondary light, e.g., red.

Incorporating Quantum Dots Beads During Bead Formation

With regard to the first option of incorporating the quantum dots directly into the primary particles (i.e., the beads) during bead formation, by way of example, suitable core, core/shell, or core/multishell nanoparticles (e.g., InP/ZnS core/shell quantum dots) may be contacted by one or more bead precursors (e.g., an acrylate monomer, a silicate material, or a combination of both) and then subjected to suitable conditions (e.g., introduction of a polymerisation initiator) to form the bead material.

By way of further example, hexadecylamine-capped CdSe-based semiconductor nanoparticles may be treated with at least one, more preferably two or more polymerisable ligands (optionally one ligand in excess) resulting in the displacement of at least some of the hexadecylamine capping layer with the polymerisable ligand(s). The displacement of the capping layer with the polymerisable ligand(s) may be accomplished by selecting a polymerisable ligand or ligands with structures similar to that of trioctylphosphine oxide (TOPO), which is a ligand with a known and very high affinity for CdSe-based nanoparticles. It will be appreciated that this basic methodology may be applied to other nanoparticle/ligand pairs to achieve a similar effect. That is, for any particular type of nanoparticle (material and/or size), one or more appropriate polymerisable surface binding ligands may be selected by choosing polymerisable ligands including a structural motif which is analogous in some way (e.g., has a similar physical and/or chemical structure) to the structure of a known surface binding ligand. Once the nanoparticles have been surface-modified in this way, they may then be added to a monomer component of a number of microscale polymerisation reactions to form a variety of quantum dot-containing resins and beads.

Examples of polymerisation methods that may be used to construct quantum dot-containing beads include, but are not limited to, suspension, dispersion, emulsion, living, anionic, cationic, RAFT, ATRP, bulk, ring closing metathesis, and ring opening metathesis. Initiation of the polymerisation reaction may be caused by any appropriate means that causes the monomers to react with one another, such as free radicals, light, ultrasound, cations, anions, heat.

A preferred method is suspension polymerisation involving thermal curing of one or more polymerisable monomers from which the primary matrix material is to be formed. Said polymerisable monomers may, for example, include methyl (meth)acrylate, ethylene glycol dimethacrylate, and/or vinyl acetate.

Quantum dot-containing beads may be generated simply by adding quantum dots to the mixture of reagents used to construct the beads. In some instances quantum dots (nascent quantum dots) are used as isolated from the reaction employed to synthesise them and are thus generally coated with an inert outer organic ligand layer. In an alternative procedure a ligand exchange process may be carried out prior to the bead forming reaction. Here one or more chemically reactive ligands (for example this might be a ligand for the quantum dots which also contains a polymerisable moiety) are added in excess to a solution of nascent quantum dots coated in an inert outer organic layer. After an appropriate incubation time the quantum dots are isolated, for example by precipitation and subsequent centrifugation, washed and then incorporated into the mixture of reagents used in the bead forming reaction/process.

Both quantum dot incorporation strategies generally result in statistically random incorporation of the quantum dots into the beads and thus the polymerisation reaction generally results in beads containing statistically similar amounts of the quantum dots. Bead size may be controlled by the choice of polymerisation reaction used to construct the beads, and additionally, once a polymerisation method has been selected, bead size may also be controlled by selecting appropriate reaction conditions, e.g., in a suspension polymerisation reaction by stirring the reaction mixture more quickly to generate smaller beads. Moreover the shape of the beads may be readily controlled by choice of procedure in conjunction with whether or not the reaction is carried out in a mould. The composition of the beads may be altered by changing the composition of the monomer mixture from which the beads are constructed. Similarly the beads may also be cross-linked with varying amounts of one or more cross-linking agents (e.g., divinyl benzene). If beads are constructed with a high degree of cross-linking, e.g., greater than 5 mol % cross-linker, it may be desirable to incorporate a porogen (e.g., toluene or cyclohexane) during the reaction used to construct the beads. The use of a porogen in such a way generally leaves permanent pores within the matrix constituting each bead. These pores may be sufficiently large to allow the ingress of quantum dots into the bead.

Incorporating Quantum Dots into Prefabricated Beads

In respect of the second option for incorporating quantum dots into the primary particles, the quantum dots may be immobilised within the primary matrix material through physical entrapment. For example, a solution of quantum dots in a suitable solvent (e.g., an organic solvent) may be incubated with a sample of primary particles. Removal of the solvent using any appropriate method results in the quantum dots becoming immobilised within the primary matrix material of the primary particles. The quantum dots remain immobilised in the particles unless the sample is resuspended in a solvent (e.g., organic solvent) in which the quantum dots are freely soluble. At this stage, the surface coating may be applied to the beads.

In a further preferred embodiment, at least a portion of the semiconductor nanoparticles may be physically attached to the prefabricated primary particles. Attachment may be achieved by immobilisation of a portion of the semiconductor nanoparticles within the polymer matrix of the prefabricated primary particles or by chemical, covalent, ionic, or physical connection between the semiconductor nanoparticles and the prefabricated primary particles. In a particularly preferred embodiment the prefabricated primary particles include polystyrene, polydivinyl benzene, and a polythiol.

Quantum dots may be irreversibly incorporated into prefabricated primary particles in a number of ways, e.g. chemical, covalent, ionic, physical (e.g., by entrapment) or any other form of interaction. If prefabricated primary particles are to be used for the incorporation of quantum dots, the solvent accessible surfaces of the primary particles may be chemically inert (e.g., polystyrene) or alternatively they may be chemically reactive/functionalised (e.g., Merrifield's Resin). The chemical functionality may be introduced during the construction of the primary particles, for example by the incorporation of a chemically functionalised monomer, or alternatively, chemical functionality may be introduced in a post-particle construction treatment step, for example by conducting a chloromethylation reaction. Additionally chemical functionality may be introduced by a post-particle construction step involving a polymeric graft or other similar process whereby chemically reactive polymer(s) are attached to the outer layers/accessible surfaces of the bead. More than one such post-construction derivatisation process may be carried out to introduce chemical functionality onto/into the primary particles.

As with quantum dot incorporation into primary particles during the particle forming reaction (i.e., the first option described above) the pre-fabricated primary particles may be of any shape, size and composition and may have any degree of cross-linker and may contain permanent pores if constructed in the presence of a porogen. Quantum dots may be imbibed into the primary particles by incubating a solution of quantum dots in an organic solvent and adding this solvent to the primary particles. The solvent is preferably capable of wetting the primary particles, and in the case of lightly crosslinked primary particles, preferably 0-10% crosslinked and most preferably 0-2% crosslinked, the solvent preferably causes the polymer matrix to swell in addition to solvating the quantum dots. Once the quantum dot-containing solvent has been incubated with the primary particles it may be removed, for example by heating the mixture and causing the solvent to evaporate and the quantum dots to become embedded in the primary matrix material constituting the primary particles, or alternatively, by the addition of a second solvent in which the quantum dots are not readily soluble but which mixes with the first solvent causing the quantum dots to precipitate within the primary matrix material. Immobilisation may be reversible if the primary particles are not chemically reactive, or else if the primary particles are chemically reactive, the quantum dots may be held permanently within the primary matrix material, by chemical, covalent, ionic, or any other form of interaction.

Incorporation of Quantum Dots into Sol-Gels to Produce Glass

As stated above, a preferred primary matrix material is an optically transparent media, such as a sol-gel or a glass. Such primary matrix materials may be formed in an analogous fashion to the method used to incorporate quantum dots into primary particles during the particle forming process as described above. For example, a single type of quantum dot (e.g., one colour) may be added to a reaction mixture used to produce a sol-gel or glass. Alternatively, two or more types of quantum dot (e.g., two or more colours) may be added to a reaction mixture used to produce a sol-gel or glass. The sol-gels and glasses produced by these procedures may have any shape, morphology or three-dimensional structure. For example, the resulting primary particles may be spherical, disc-like, rod-like, ovoid, cubic, rectangular, or any of many other possible configurations.

Application of Surface Coating

In a preferred embodiment, where it is desired to provide a surface coating including an inorganic material on the quantum dot-containing primary particles, such as a metal oxide or metal nitride, a particularly preferred process to deposit the coating is atomic layer deposition (ALD), although it will be appreciated that other suitable techniques may be employed.

The provision of a surface coating by ALD, using a metal oxide surface coating as an example, typically includes the following four basic steps:

1) Exposing a surface of a quantum dot-containing primary particle to a metal precursor;

2) Purging the reaction chamber containing the primary particles to remove non-reacted metal precursor and any gaseous reaction by-products;

3) Exposing the surface of the primary particles to an oxide precursor; and

4) Purging the reaction chamber.

The above steps may then be repeated any desirable number of times to provide a surface coating of the desired thickness, for example, a thickness of around 1 to 500 nm. Each reaction cycle adds a predetermined amount of coating material to the surface of the primary particles. One cycle may take time from around 0.5 seconds to around 2-3 seconds and deposit between 1 and 30 nm of surface coating.

Before initiating the ALD process, it is preferred that the surface of the primary particles be heat treated to ensure their stability during the ALD process. It will be appreciated that since ALD is essentially a surface-controlled process, where process parameters other than the precursors, substrate (i.e., primary particle material), reaction temperature (typically around 100 to 400° C., but may be as high as 500° C.), and, to a lesser extent pressure (typically around 1 to 10 mbar), have little or no influence on the final surface coating, ALD-grown surface layers or films are extremely conformal and uniform in thickness, making ALD is a particularly preferred method for depositing protective coatings onto the surface of quantum dot-containing primary particles.

A particularly preferred surface coating is $Al_2O_3$. An $Al_2O_3$ surface coating of only up to around 20 to 30 nm applied by ALD at a temperature of around 100 to 175° C. using trimethylaluminium and water as precursors may exhibit a very low water vapour transmission rate and permeability to other gases and liquids.

It has been determined that ALD coatings applied to quantum dot-containing primary particles often result in the deposition of a greater quantity of the surface coating material, e.g., $Al_2O_3$ than would be anticipated if the only surface being coated was the external surface of the primary particle. It has been established that an improvement in the level or protection afforded by the surface coating may be achieved by increasing the amount of surface coating material deposited beyond the amount theoretically required to coat just the calculated external surface area. While the inventors do not wish to be bound by any particular theory, it is believed that this is at least partly due to the ALD process coating not just the external surface area of the primary particles, but that it deposits coating material on at least some, if not substantially all of the accessible or effective surface area of the primary particle which includes internal voids that are accessible from the outside of the primary particle. Thus, when porous, and particularly when highly porous polymeric bead-type materials are coated using ALD, it has been observed that the coating material is deposited inside the voids and pores of the primary particles, as well as the outermost surface of the particles. In this way, the ALD process may be used to reduce the porosity of the quantum dot-containing primary particles to unexpectedly and surprisingly low levels, thereby providing a degree of protection to the particles which is beyond that which would have been anticipated by the skilled person. This has important consequences in terms of the processibility and optical performance of the final coated quantum dot-containing primary particles, both of which may be greatly enhanced compared to prior art quantum dot-based materials, by the use of ALD to provide a surface coating of, for example, $Al_2O_3$.

By way of example, it is known that heat treatment of prior art quantum dot-containing materials to the temperatures typically required during LED manufacture (200° C. and above) degrades the performance of the materials to unacceptably low levels. Moreover, the ability to photobrighten such materials is also significantly diminished or effectively lost following heat treatment. This places serious limitations on the use of quantum dot-based materials in applications such as LED fabrication, as well as other manufacturing processes involving heat treatment of components. Aspects of the present invention, however, offer convenient solutions to these problems with prior art materials and methods. By the use of ALD to deposit a coating material, such as but not limited to $Al_2O_3$, to primary particles containing quantum dots, the coated materials may be heat-treated at temperatures of up to at least 250° C. and, not only do the materials remain structurally sound, but they may be photobleached to substantially restore their original quantum emission (i.e., before coating and heat treatment).

In an alternative preferred embodiment, the surface coating may be produced in-situ on the surface of the primary particles. By way of example, a surface of quantum dot-containing primary particles may be contacted by polymerisable monomers which are then polymerised on the surface of the particles to produce a polymeric surface coating on the particles. One method by which contacting of the particles by the monomers may be effected is to disperse the particles within a monomer mixture, optionally including a crosslinking agent and, if necessary, a polymerisation initiator, such as a photoinitiator. Polymerisation may then be effected in any manner appropriate for the monomers being used, for example if photopolymerisable monomers are used, then the polymer mixture containing the primary particles and the optional photoinitiator may then be exposed to a suitable source of radiation (e.g., UV).

FIGS. 7 to 10 depict alternative preferred arrangements of quantum dot-containing primary particles provided with a protective surface coating.

Figure 7:
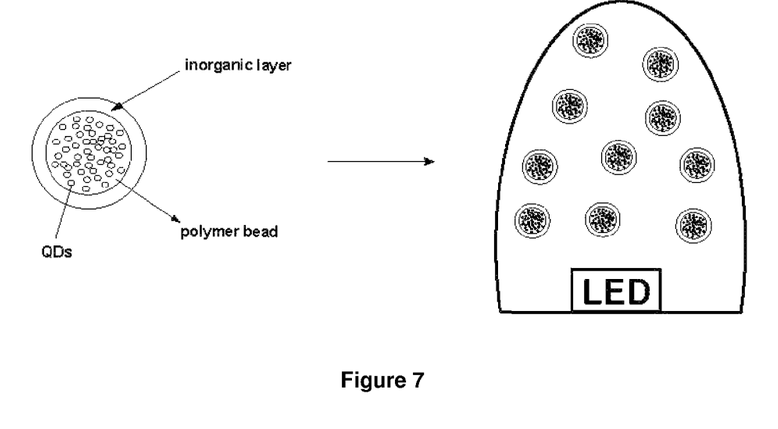
FIG. 7 is a schematic representation of a population of quantum dots entrapped within a primary particle in the form of a polymer bead in which the primary particle is provided with a surface coating of an inorganic material according to a preferred embodiment of the present invention, and the primary particles are dispersed within a secondary matrix material in the form of an LED encapsulant disposed on an LED to provide a light-emitting device according to a preferred embodiment of the present invention.
Figure 8:
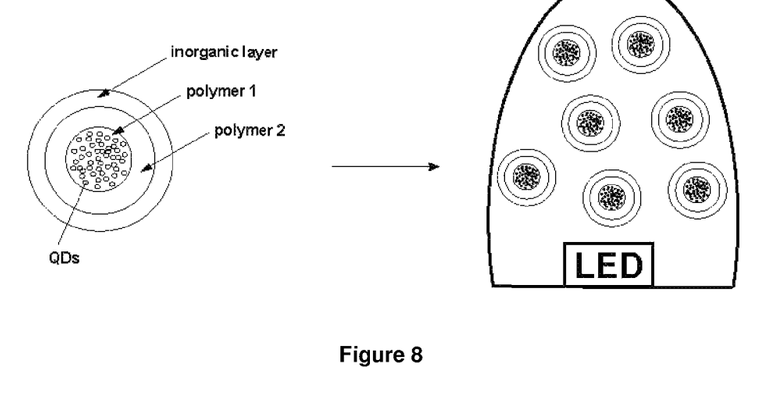
FIG. 8 is a schematic representation of a population of quantum dots entrapped within a primary particle in the form of a polymer bead made from a first type of polymer (polymer 1) which is encapsulated within a second type of polymer material (polymer 2) which is provided with a surface coating of an inorganic material according to a preferred embodiment of the present invention, and the encapsulated primary particles are dispersed within a secondary matrix material in the form of an LED encapsulant disposed on an LED to provide a light-emitting device according to a preferred embodiment of the present invention.
Figure 9:
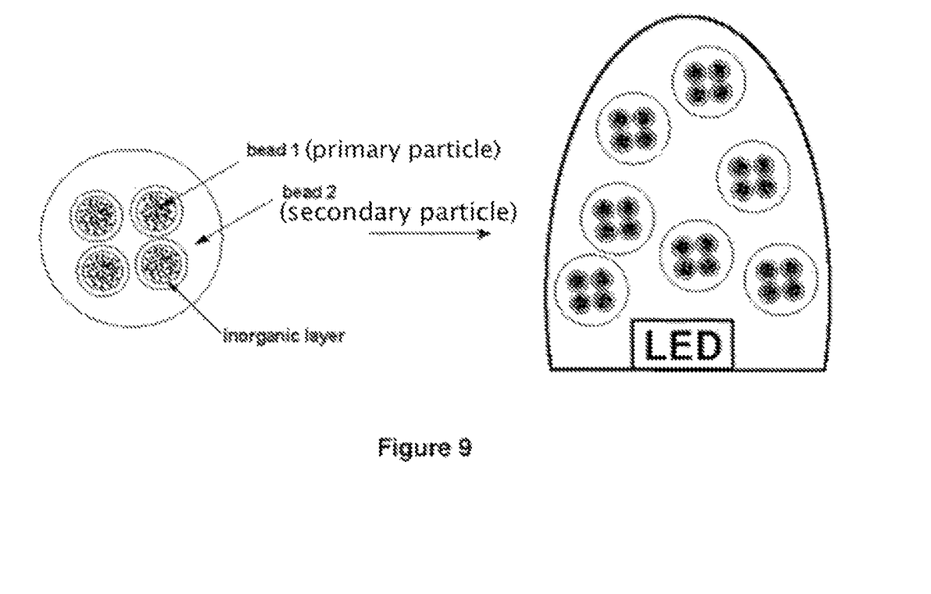
FIG. 9 is a schematic representation of a population of quantum dots entrapped within a population of primary particles in the form of polymer beads (bead 1) in which each of the primary particles is provided with a surface coating of an inorganic material according to a preferred embodiment of the present invention, before dispersing the coated primary particles within a second type of bead (bead 2) to produce a "bead-in-bead" composite material, and then dispersing the bead-in-bead composite material within a secondary matrix material in the form of an LED encapsulant disposed on an LED to provide a light-emitting device according to a preferred embodiment of the present invention.
Figure 10:
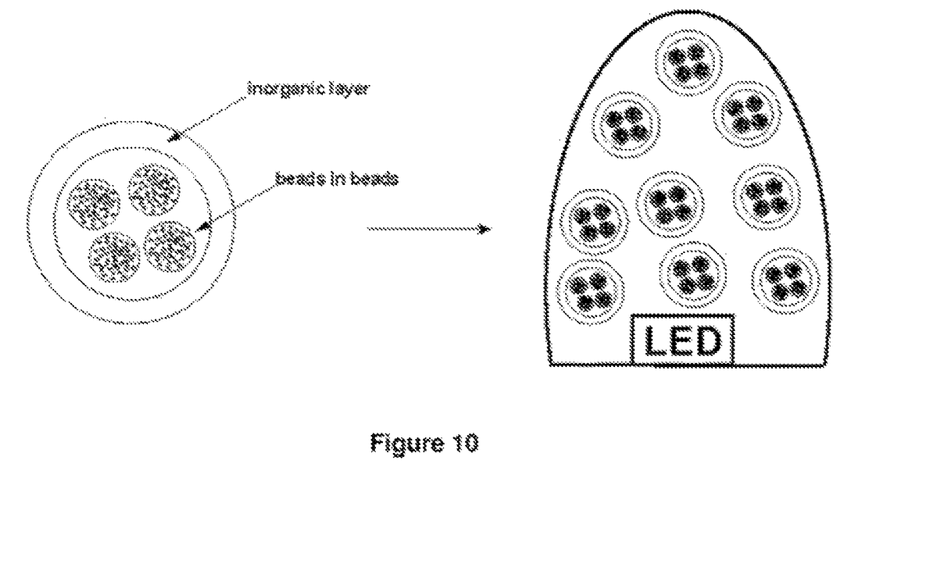
FIG. 10 is a schematic representation of a population of quantum dots entrapped within a population of primary particles in the form of polymer beads, the population of primary particles being dispersed within a second type of bead to produce a "bead-in-bead" composite material which is then provided with an inorganic surface coating layer according to a preferred embodiment of the present invention, and then dispersing the bead-in-bead composite material within a secondary matrix material in the form of an LED encapsulant disposed on an LED to provide a light-emitting device according to a preferred embodiment of the present invention.

FIG. 7 illustrates a population of quantum dots entrapped within a primary particle in the form of a polymer bead. The primary particle is provided with a surface coating of an inorganic material according to a preferred embodiment of the present invention, before being dispersed within a secondary matrix material in the form of an LED encapsulant disposed on an LED to provide a light emitting device according to a preferred embodiment of the present invention. FIG. 8 depicts a population of quantum dots entrapped within a primary particle in the form of a polymer bead made from a first type of polymer (polymer 1) which is encapsulated within a second type of polymer material (polymer 2). The surface of the second type of polymer is provided with a protective surface coating of an inorganic material according to a preferred embodiment of the present invention. The encapsulated primary particles are then dispersed within a secondary matrix material in the form of an LED encapsulant disposed on an LED to provide a light emitting device according to a preferred embodiment of the present invention. FIG. 9 illustrates a population of quantum dots entrapped within a population of primary particles in the form of polymer beads (bead 1) in which each of the primary particles is provided with a surface coating of an inorganic material according to a preferred embodiment of the present invention. The coated primary particles are shown dispersed within a second type of bead (bead 2) to produce a "bead-in-bead" composite material, which may be dispersed, as shown, within a secondary matrix material in the form of an LED encapsulant disposed on an LED to provide a light-emitting device according to a preferred embodiment of the present invention. FIG. 10 depicts a population of quantum dots entrapped within a population of primary particles in the form of polymer beads, the population of primary particles being dispersing within a second type of bead to produce a "bead-in-bead" composite material which is then provided with an inorganic surface coating layer according to a preferred embodiment of the present invention. The coated bead-in-bead composite material may then be dispersed within a secondary matrix material as shown in the form of an LED encapsulant disposed on an LED to provide a light-emitting device according to a preferred embodiment of the present invention.

Application of Coated QD-Beads—Incorporation into LED Encapsulant

While the provision of a surface coating to beads containing quantum dots has many advantages as outlined above, one significant advantage of embodiments of the present invention is that coated quantum dot-beads (coated QD-beads) produced as described above may be incorporated into commercially available LED encapsulant materials simply by weighing the desired amount of coated QD-bead material and adding this to the desired amount of LED encapsulant material.

It is preferred that the bead/encapsulant composite be mixed thoroughly to provide a homogeneous mixture. The mixture may then be dispensed onto a commercially available LED and cured according to normal curing procedures for the particular LED-encapsulant used. The coated QD-beads thus provide a simple and straightforward way of facilitating the formulation of bead/LED encapsulant composites which may be used in the fabrication of next-generation, higher performance light-emitting devices using, as far as possible, standard commercially available materials and methods.

LED Encapsulating Materials

Any existing commercially available LED encapsulant may be used with coated QD-beads produced according to embodiments of the present invention. Preferred LED encapsulants include silicones, epoxies, (meth)acrylates and other polymers, although it will be appreciated by the skilled person that further options are available, such as but not limited to silica glass, silica gel, siloxane, sol gel, hydrogel, agarose, cellulose, epoxy, polyether, polyethylene, polyvinyl, poly-diacetylene, polyphenylene-vinylene, polystyrene, polypyrrole, polyimide, polyimidazole, polysulfone, polythiophene, polyphosphate, poly(meth)acrylate, polyacrylamide, polypeptide, polysaccharide, and combinations thereof.

LED encapsulants which may be used include, but are not limited to, UV-curable encapsulants and heat-curable encapsulants, including encapsulants which require one or more catalysts to support the curing process. Specific examples of commercially available silicone encapsulants which are suitable may be selected from the group consisting of SCR1011, SCR1012, SCR1016. LPS-3412 (all available from Shin Etsu) and examples of suitable epoxy encapsulants may be selected from the group consisting of Pacific Polytech PT1002, Fine Polymers Epifine EX-1035A, and Fine Polymers Epifine X-1987.

Colour Indexing

The colour of the light output from a coated QD-bead-LED (the "secondary light") may be measured using a spectrometer. The spectral output (mW/nm) may then be processed mathematically so that the particular colour of the light-emitting device may be expressed as colour coordinates on a chromaticity diagram, for example the 2° CIE 1931 chromaticity diagram (see FIG. 2).

Figure 3:
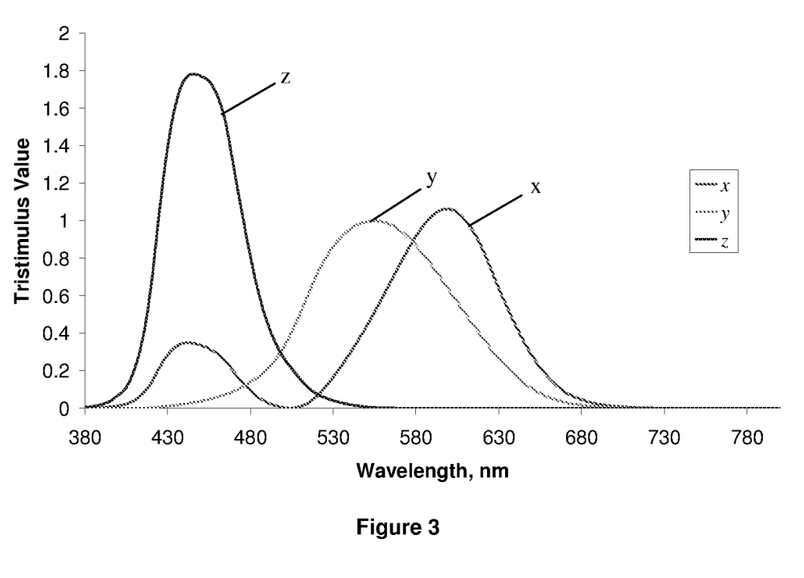
FIG. 3 is a 2° CIE 1931 colour matching diagram matching functions x, y, z.

The 2° CIE 1931 chromaticity coordinates for a particular spectrum may be calculated from the spectral power distribution and the CIE 1931 colour matching functions x, y, z (see FIG. 3). The corresponding tri-stimulus values may be calculated thus $$X=\int px d\lambda\ Y=\int py d\lambda\ Z=\int pz d\lambda$$

Where p is the spectral power, and x, y and z are the colour-matching functions.

From X, Y, and Z the chromaticity coordinates x, y may be calculated according to $$x=X/(X+Y+Z) \text{ and } y=Y/(X+Y+Z)$$

Figure 2:
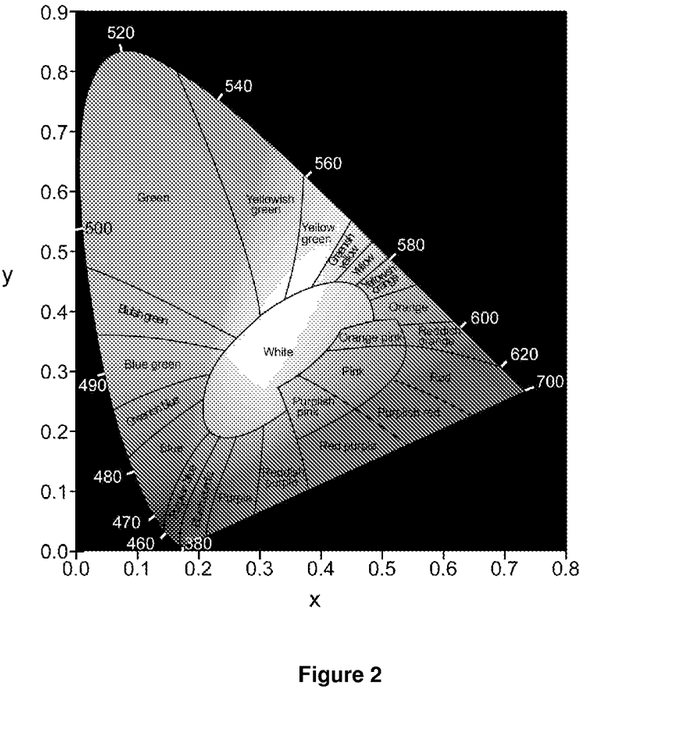
FIG. 2 is a 2° CIE 1931 chromaticity diagram.

Using x, y as the coordinates, a two-dimensional chromaticity diagram (the CIE 1931 colour space diagram) may be plotted which is analogous to the exemplary diagram depicted in FIG. 2.

Colour Rendering

Colour rendering describes the ability of a light source to illuminate objects such that they appear the correct colour when compared to how they appear when illuminated by a reference light source. Usually the reference light source is a tungsten-filament bulb which is assigned a colour rendering index (CRI) of 100. To be acceptable for general lighting, a white light-emitting device source typically has a CRI>80. An example of poor colour rendering is the sodium street lamp, which has very poor colour rendering capability, i.e., it is difficult to distinguish a red car from a yellow car illuminated by a sodium lamp, in the dark under a sodium lamp they both appear grey.

Embodiments of the present invention provide a plurality of robust, high-performance coated QD-beads which may be used to fabricate a light-emitting device. The quantum dots within the primary particles or beads are generally in optical communication with a primary solid-state photon/light source (e.g., an LED, laser, arc lamp, or black-body light source) such that, upon excitation by primary light from the primary light source the quantum dots within the primary particles emit secondary light of a desired colour. The required intensities and emission wavelengths of the light emitted from the device itself may be selected according to appropriate mixing of the colour of the primary light with that of the secondary light(s) produced from the down-conversion of the primary light by the quantum dots. Moreover, the size (and thus emission) and number of each type of quantum dot within the primary particles may be controlled, as may the size, morphology and constituency of the primary matrix material making up the primary particles, such that subsequent mixing of the quantum dot-containing media allows light of any particular colour and intensity to be produced.

It will be appreciated that the overall light emitted from the device may consist effectively of the light emitted from the quantum dots, i.e., just the secondary light, or a mixture of light emitted from the quantum dots and light emitted from the solid-state/primary light source, i.e., a mixture of the primary and secondary light. Colour mixing of the quantum dots may be achieved either within the quantum dot-containing media (e.g., within each bead in a population of beads such that each bead contains a number of different size/colour emitting quantum dots) or a mixture of differently coloured primary matrix materials with all the quantum dots within a specific matrix material being the same size/colour (e.g., some beads containing all green quantum dots and others containing all red quantum dots).

EXAMPLES

Embodiments of the present invention are illustrated with reference to the following non-limiting examples.

Example 1 below describes the preparation of coated quantum dot-containing beads, which may, for example, be used in the fabrication of new, improved quantum dot-based light-emitting devices. The Synthetic Methods section provides two methods for producing quantum dots (1.1 and 1.2) and three methods for incorporating quantum dots into primary particles or "beads" (2.1, 2.2 and 2.3).

Synthetic Methods 1.1 Preparation of CdSe/ZnS Core/Shell Quantum Dots

Preparation of CdSe Cores

HDA (500 g) was placed in a three-neck round bottomed flask and dried and degassed by heating to 120° C. under a dynamic vacuum for >1 hour. The solution was then cooled to 60° C. To this was added 0.718 g of $[HNEt_3]_4[Cd_{10}Se_4$ (SPh)$_{16}$] (0.20 mmols). In total 42 mmols, 22.0 ml of TOPSe and 42 mmols, (19.5 ml, 2.15 M) of Me$_2$Cd.TOP was used. Initially 4 mmol of TOPSe and 4 mmols of Me$_2$Cd.TOP were added to the reaction at room temperature and the temperature increased to 110° C. and allowed to stir for 2 hours. The reaction was a deep yellow colour, the temperature was progressively increased at a rate of ~1° C./5 min with equimolar amounts of TOPSe and Me$_2$Cd.TOP being added dropwise. The reaction was stopped when the PL emission maximum had reached ~600 nm, by cooling to 60° C. followed by addition of 300 ml of dry ethanol or acetone. This produced a precipitation of deep red particles, which were further isolated by filtration. The resulting CdSe particles were recrystallized by re-dissolving in toluene followed by filtering through Celite followed by re-precipitation from warm ethanol to remove any excess HDA, selenium or cadmium present. This produced 10.10 g of HDA capped CdSe nanoparticles. Elemental analysis C=20.88, H=3.58, N=1.29, Cd=46.43%. Max PL=585 nm, FWHM=35 nm. 38.98 mmols, 93% of Me$_2$Cd consumed in forming the quantum dots.

Growth of ZnS Shell

HDA (800 g) was placed in a three neck round-bottom flask, dried and degassed by heating to 120° C. under a dynamic vacuum for >1 hour. The solution was then cooled to 60° C., to this was added 9.23 g of CdSe nanoparticles that have a PL maximum emission of 585 nm. The HDA was then heated to 220° C. To this was added by alternate dropwise addition a total of 20 ml of 0.5 M Me$_2$Zn.TOP and 0.5 M, 20 ml of sulfur dissolved in octylamine. Three alternate additions of 3.5, 5.5 and 11.0 ml of each were made, whereby initially 3.5 ml of sulphur was added dropwise until the intensity of the PL maximum was near zero. Then 3.5 ml of Me$_2$Zn.TOP was added dropwise until the intensity of the PL maximum had reached a maximum. This cycle was repeated with the PL maximum reaching a higher intensity with each cycle. On the last cycle, additional precursor was added once the PL maximum intensity been reached until it was between 5-10% below the maximum intensity, and the reaction was allowed to anneal at 150° C. for 1 hour. The reaction mixture was then allowed to cool to 60° C. whereupon 300 ml of dry "warm" ethanol was added which resulted in the precipitation of particles. The resulting CdSe—ZnS particles were dried before re-dissolving in toluene and filtering through Celite followed by re-precipitation from warm ethanol to remove any excess HDA. This produced 12.08 g of HDA capped CdSe—ZnS core-shell nanoparticles. Elemental analysis C=20.27, H=3.37, N=1.25, Cd=40.11, Zn=4.43%; Max PL 590 nm, FWHM 36 nm.

1.2 Preparation of InP/ZnS Core/Shell Quantum Dots

Preparation of InP Cores (500-700 nm Emission)

Di-butyl ester (100 ml) and Myristic acid (10.0627 g) were placed in a three-neck flask and degassed at 70° C. under vacuum for one hour. After this period, nitrogen was introduced and the temperature increased to 90° C. ZnS molecular cluster [Et$_3$NH$_4$][Zn$_{10}$S$_4$(SPh)$_{16}$] (4.7076 g) was added and the mixture allowed to stir for 45 minutes. The temperature was then increased to 100° C. followed by the dropwise addition of In(MA)$_3$ (1 M, 15 ml) followed by (TMS)$_3$P (1 M, 15 ml). The reaction mixture was allowed to stir while increasing the temperature to 140° C. At 140° C., further dropwise additions of In(MA)$_3$ (1 M, 35 ml) (left to stir for 5 minutes) and (TMS)$_{3P}$ (1 M, 35 ml) were made. The temperature was then slowly increased to 180° C. and further dropwise additions of In(MA)$_3$ (1 M, 55 ml) followed by (TMS)$_3$P (1 M, 40 ml) were made. By addition of the precursor in the manner above nanoparticles of InP could be grown with the emission maximum gradually increasing from 520 nm up to 700 nm, whereby the reaction may be stopped when the desired emission maximum has been obtained and left to stir at this temperature for half an hour. After this period, the temperature was decreased to 160° C. and the reaction mixture was left to anneal for up to 4 days (at a temperature between 20-40° C. below that of the reaction). A UV lamp was also used at this stage to aid in annealing.

The nanoparticles were isolated by the addition of dried degassed methanol (approx. 200 ml) via cannula techniques. The precipitate was allowed to settle and then methanol was removed via cannula with the aid of a filter stick. Dried degassed chloroform (approx. 10 ml) was added to wash the solid. The solid was left to dry under vacuum for 1 day. This produced 5.60 g of InP core nanoparticles. Elemental analysis: max PL=630 nm, FWHM=70 nm.

Post-Operative Treatments

The quantum yields of the InP quantum dots prepared above were increased by washing with dilute HF acid. The dots were dissolved in anhydrous degassed chloroform (~270 ml). A 50 ml portion was removed and placed in a plastic flask, flushed with nitrogen. Using a plastic syringe, the HF solution was made up by adding 3 ml of 60% w/w HF in water and adding to degassed THF (17 ml). The HF was added dropwise over 5 hrs to the InP dots. After addition was complete the solution was left to stir overnight. Excess HF was removed by extracting through calcium chloride solution in water and drying the etched InP dots. The dried dots were re-dispersed in 50 ml chloroform for future use. Max 567 nm, FWHM 60 nm. The quantum efficiencies of the core materials at this stage range from 25-90%.

Growth of ZnS Shell

A 20 ml portion of the HF etched InP core particles was dried down in a 3-neck flask. 1.3 g myristic acid and 20 ml di-n-butyl sebacate ester was added and degassed for 30 minutes. The solution was heated to 200° C. then 1.2 g anhydrous zinc acetate was added and 2 ml 1 M (TMS)$_2$S was added dropwise (at a rate of 7.93 ml/hr) after addition was complete the solution was left to stir. The solution was kept at 200° C. for 1 hr then cooled to room temperature. The particles were isolated by adding 40 ml of anhydrous degassed methanol and centrifuged. The supernatant liquid was disposed of and to the remaining solid 30 ml of anhydrous degassed hexane was added. The solution was allowed to settle for 5 hrs and then re-centrifuged. The supernatant liquid was collected and the remaining solid was discarded. PL emission peak Max.=535 nm, FWHM=65 nm. The quantum efficiencies of the nanoparticle core/shell materials at this stage ranged from 35-90%.

2.1 Incorporating Quantum Dots into Suspension Polymeric Beads

1% wt/vol polyvinyl acetate (PVA) (aq) solution was prepared by stirring for 12 hours followed by extensive degassing by bubbling nitrogen through the solution for a minimum of 1 hour. The monomers, methyl methacrylate and ethylene glycol dimethacrylate, were also degassed by nitrogen bubbling and used with no further purification. The initiator AIBN (0.012 g) was placed into the reaction vessel and put under three vacuum/nitrogen cycles to ensure no oxygen was present.

CdSe/ZnS core/shell quantum dots as prepared above in Method 1 were added to the reaction vessel as a solution in toluene and the solvent removed under reduced pressure. Degassed methyl methacrylate (0.98 mL) was then added followed by degassed ethylene glycol dimethacrylate (0.15 mL). The mixture was then stirred at 800 rpm for 15 minutes to ensure complete dispersion of the quantum dots within the monomer mixture. The solution of 1% PVA (10 mL) was then added and the reaction stirred for 10 minutes to ensure the formation of the suspension. The temperature was then raised to 72° C. and the reaction allowed to proceed for 12 hours.

The reaction mixture was then cooled to room temperature and the beaded product washed with water until the washings ran clear followed by methanol (100 mL), methanol/tetrahydrofuran (1:1, 100 mL), tetrahydrofuran (100 mL), tetrahydrofuran/dichloromethane (1:1, 100 mL), dichloromethane (100 mL), dichloromethane/tetrahydrofuran (1:1, 100 mL), tetrahydrofuran (100 mL), tetrahydrofuran/methanol (1:1, 100 mL), methanol (100 mL). The quantum dot-containing beads (QD-beads) were then dried under vacuum and stored under nitrogen.

2.2 Adsorbing Quantum Dots into Prefabricated Beads

Polystyrene microspheres with 1% divinyl benzene (DVB) and 1% thiol co-monomer were resuspended in toluene (1 mL) by shaking and sonication. The microspheres were centrifuged (6000 rpm, approx 1 min) and the supernatant decanted. This was repeated for a second wash with toluene and the pellets then resuspended in toluene (1 mL).

InP/ZnS quantum dots as prepared above in Method 2 were dissolved (an excess, usually 5 mg for 50 mg of microspheres) in chloroform (0.5 mL) and filtered to remove any insoluble material. The quantum dot-chloroform solution was added to the microspheres in toluene and shaken on a shaker plate at room temperature for 16 hours to mix thoroughly.

The quantum dot-microspheres were centrifuged to pellet and the supernatant decanted off, which contained any excess quantum dots present. The pellet was washed (as above) twice with toluene (2 mL), resuspended in toluene (2 mL), and then transferred directly to glass sample vials used in an integrating sphere. The glass vials were pelleted down by placing the vials inside a centrifuge tube, centrifuging and decanting off excess toluene. This was repeated until all of the material had been transferred into the sample vial. A quantum yield analysis was then run directly on the pellet, wet with toluene.

2.3 Incorporation of Quantum Dots into Silica Beads 0.4 mL of InP/ZnS core shell quantum dots capped with myristic acid (around 70 mg of inorganic) was dried under vacuum. 0.1 mL of (3-(trimethoxysilyl)propyl methacrylate (TMOPMA), followed by 0.5 mL of triethylorthosilicate (TEOS) was injected to dissolve the dried quantum dots and form a clear solution, which was kept for incubation under $N_2$ overnight. The mixture was then injected into 10 mL of a reverse microemulsion (cyclohexane/CO-520, 18 ml/1.35 g) in 50 mL flask, under stirring @ 600 rpm. The mixture was stirred for 15 mins and then 0.1 mL of 4% $NH_4OH$ was injected to start the bead forming reaction. The reaction was stopped the next day by centrifugation to collect the solid phase. The obtained particles were washed twice with 20 mL cyclohexane and then dried under vacuum.

Example 1

Coating Quantum Dot-Containing Silica Beads with Polymethyl-Methacrylate 25 mg powdered quantum dots-containing silica beads was dispersed as well as possible in degassed methylmethacrylate (MMA). A photoinitiator, phenylbis(2,4,6-trimethylbenzoyl)phosphine oxide, was added to a crosslinker, trimethylolpropanetrimethacrylate (TMPTM), and dissolved while the solution was degassed. The TMPTM crosslinker was then added to the MMA and silica and the mixture agitated on a whirlmixer to ensure homogeneous mixing of the monomer and crosslinker. The resulting slurry was transferred to a syringe with a wide bore needle and then continuously agitated while being injected into 5 mL of degassed 2% PVA stirring at 1200 rpm. The suspension was then exposed to 365 nm UV light for 30 minutes. The mixture was stirred overnight and worked-up the following morning by washing and centrifugation. Washes of 2.times.20 mL of $H_2O$ and 2.times.20 mL EtOH and centrifugation of 2000 rpm for 2 mins between washes. The sample was finally dried under vacuum and purged with $N_2$.

Example 2

GelestHardsil AR Coating Polymeric Bead Procedure

A stock solution of GelestHardsil AR (2000 μl) and Zn-2-ethylhexanoate (10 μl) was made. Under a $N_2$ (g) atmosphere, an aliquot (150 μL) of the GelestHardsil AR/Zn-2-ethylhexanoate stock solution was added to CFQD-Beads (30 mg) in a glass vial (~7 mL), incubated (overnight), placed under high vacuum (overnight) and a screw cap lid fitted to the vial. The sample was removed the glove box and placed in a preheated (220° C.) heating block mounted on a hot plate (20 min).

Example 3

Poly(vinylalcohol) Coating Quantum Dot-Beads Procedure

A stock solution of poly(vinylalcohol) (87-89% hydrolysed, MW=85000-124000) (0.05 g) dissolved (100° C.) in ethyleneglycol (5 ml) was made. Under a $N_2$ (g) atmosphere, an aliquot (150 μL) of the poly(vinylalcohol)/ethyleneglycol stock solution was added to quantum dot beads, mixed and placed under high vacuum overnight to give a dry powder (QY=35%, PL=527 nm, FWHM=70 nm).

Example 4

Polymerisation Coating of Quantum Dot Beads with Glycidylmethacrylate with $BF_3$&UV-Light Under a $N_2$ (g) atmosphere, a stock solution of glycidyl methacrylate (inhibitor removed) (1406 μl), $BF_3.OEt_2$ (12.3 μl) and Irgacure 819 (9 mg) was made. An aliquot (100 μl) of the stock solution was added to quantum dot-beads (20 mg), mixed and irradiated with UV-LED (Hamamatsu UV-LED, 3 min). The samples were returned to the glove box to allow the epoxide polymerisation to proceed.

Example 5

Optocast Coating Quantum Dot-Bead Procedure

A stock solution of epoxy resin (Optocast 3553, 30 μl) dissolved in diethylether (1470 μl) was made. Under a $N_2$ (g) atmosphere, an aliquot (150 μL) of the Optocast/diethylether stock solution was added to quantum dot beads (30 mg), mixed, incubated (1.5 hr), placed under high vacuum overnight and irradiated (Hg-lamp, 400 W, 5 min) to give a particles (QY=30%, PL=515 nm, FWHM=70 nm).

It will be seen that the techniques described herein provide a basis for improved production of nanoparticle materials. The terms and expressions employed herein are used as terms of description and not of limitation, and there is no intention in the use of such terms of and expressions of excluding any equivalents of the features shown and described or portions thereof. Instead, it is recognized that various modifications are possible within the scope of the invention claimed.

What is claimed is:

1. A method for preparing a bead-in-bead composite material, the method comprising:
   randomly incorporating a population of semiconductor nanoparticles within a plurality of primary beads, each primary bead comprising a primary matrix material;
   providing each of said primary beads with a separate layer of a first surface coating material to form a plurality of coated primary beads; and
   dispersing the plurality of coated primary beads within a secondary bead to form the bead-in-bead composite material, the secondary bead comprising a secondary matrix material.

2. The method recited in claim 1, wherein the surface coating is provided separately on each primary particle by a chemical deposition technique.

3. The method recited in claim 2, wherein said technique is atomic layer deposition.

4. The method recited in claim 3, wherein said atomic layer deposition process employs a reaction temperature of around 100 to 500° C.

5. The method recited in claim 3, where said atomic layer deposition process is controlled to provide a surface coating layer thickness of around 1 to 500 nm.

6. The method recited in claim 3, wherein said atomic layer deposition process employs a metal precursor and an oxide precursor to deposit one or more layers of a metal oxide on a surface of the primary beads.

7. The method recited in claim 1, wherein the surface coating is produced in-situ on a surface of each primary bead.

8. The method recited in claim 7, wherein producing the surface coating comprises contacting said surface of each primary particle with one or more polymerizable monomers and subsequently polymerizing said monomer(s) on the surface of each primary bead to produce a separate polymeric surface coating on each primary bead.

9. The method recited in claim 8, wherein contacting of the primary beads by the polymerizable monomer(s) is effected by dispersing the primary beads within a monomer mixture, optionally including a crosslinking agent and/or polymerization initiator, and subsequently effecting polymerization of the monomer(s).

10. The method of claim 1, wherein the primary beads are prefabricated beads.

11. The method of claim 10, wherein the prefabricated beads are silica beads.

12. The method of claim 10, wherein the prefabricated beads are any one of a polystyrene bead, a polydivinyl benzene bead, and a polythiol bead.

13. The method of claim 10, wherein the prefabricated beads are porous.

14. The method of claim 1, wherein the secondary matrix material is selected from the group consisting of a polymer, a resin, a monolith, a glass, sol gel, an epoxy, a silicone, and a (meth)acrylate.

15. The method of claim 1, further comprising:
    coating the secondary bead with a layer of a second surface coating material to form a coated secondary bead.

* * * * *